(12) United States Patent
Tsai et al.

(10) Patent No.: US 7,346,814 B2
(45) Date of Patent: Mar. 18, 2008

(54) SYSTEM AND METHOD FOR CONTROLLING POWER SOURCES OF MOTHERBOARDS UNDER TEST THROUGH NETWORKS

(75) Inventors: Hung-Yuan Tsai, Tu-Cheng (TW); San Xiao, Shenzhen (CN); Ge-Xin Zeng, Shenzhen (CN)

(73) Assignees: Hong Fu Jin Precision Industry (Shenzhen) Co., Ltd., Bao-an District, Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 597 days.

(21) Appl. No.: 11/025,886

(22) Filed: Dec. 28, 2004

(65) Prior Publication Data

US 2005/0257076 A1    Nov. 17, 2005

(30) Foreign Application Priority Data

May 15, 2004    (CN) .................. 2004 1 0027255

(51) Int. Cl.
*G06F 11/00* (2006.01)
(52) U.S. Cl. ....................................... 714/55
(58) Field of Classification Search ............. 714/55, 714/25, 27, 43, 56
See application file for complete search history.

(56) References Cited

U.S. PATENT DOCUMENTS

| | | | |
|---|---|---|---|
| 5,861,882 A * | 1/1999 | Sprenger et al. ............ | 715/700 |
| 6,330,587 B1 * | 12/2001 | Tedone et al. .............. | 709/201 |
| 2005/0075824 A1 * | 4/2005 | Lee ........................... | 702/130 |
| 2005/0204243 A1 * | 9/2005 | Hu et al. .................... | 714/742 |

* cited by examiner

*Primary Examiner*—Nadeem Iqbal
(74) *Attorney, Agent, or Firm*—Morris Manning Martin LLP; Tim Tingkang Xia, Esq.

(57) ABSTRACT

A system for controlling power sources of motherboards under test through networks includes a central server (1), a serial device server (3), a bus distributor (4), a number of power controllers (5), and a number of testing computers (8). The central server sets testing parameters, and transmits instructions regarding turning on or off power sources of the testing computers to the serial device server, in order to control the power sources of the testing computers. The serial device server converts the instructions into serial instructions, and generates corresponding serial signals. The bus distributor distributes an address for each power controller, receives the serial signals, and transmits the serial signals to corresponding power controllers. Each power controller turns on power sources of corresponding testing computers in which motherboards under test are installed according to the received serial signal. A related method is also disclosed.

13 Claims, 5 Drawing Sheets

SYSTEM AND METHOD FOR CONTROLLING POWER SOURCES OF MOTHERBOARDS UNDER TEST THROUGH NETWORKS

BACKGROUND OF THE INVENTION

1. Field of the Invention

The present invention relates generally to electronic systems and methods for controlling power sources, and especially to a system and method for controlling power sources of motherboards through networks in the course of testing the motherboards.

2. Description of the Related Art

With the rapid development of electronics technology, computers have become an indispensable tool for information processing by many individuals and organizations alike. As the mass production of computers continues to accelerate, the mechanical and electrical stability of the computer motherboard is becoming increasingly important. To ensure the stability of newly manufactured computer motherboards, the motherboards must pass a series of standard tests prior to shipment to customers. On/off testing is a major standard test of a computer motherboard.

Traditionally, on/off testing has been performed by manually switching corresponding power sources on and off. However, the number of repetitions of switching that can be performed manually is inherently limited. In addition, by their very nature, some motherboard problems can only be detected by tests which require frequent or continuous switching. When such tests are performed manually, the problems are difficult to find. Furthermore, manual switching and testing is highly labor-intensive and time consuming, and is subject to human error. These difficulties frequently result in poor testing precision, and the motherboards in a batch effectively end up being tested according to non-uniform quality standards.

Moreover, in large-scale enterprises, the quantity of motherboards under test can be exceedingly large. This exacerbates the above-described problems.

Accordingly, what is needed is a system and method for controlling power sources of motherboards under test through one or more communication networks, whereby the above-described problems can be overcome.

SUMMARY OF THE INVENTION

A main objective of the present invention is to provide a system which can automatically control a plurality of power sources of motherboards under test, the motherboards residing in testing computers, and the control being routed from a server through networks to the testing computers.

Another objective of the present invention is to provide a method which can automatically control a plurality of power sources of motherboards under test, and the control being routed from a server through networks to the testing computers.

To achieve the first objective, the present invention provides a system for controlling power sources of motherboards under test through networks. The system comprises a central server, a serial device server, a bus distributor, a plurality of power controllers, and a plurality of testing computers connected with the power controllers through power control lines. The central server sets testing parameters, and transmits instructions regarding turning on or off power sources of testing computers to the serial device server, in order to control power sources. The serial device server converts the instructions into serial instructions, and generates corresponding serial signals. The bus distributor distributes an address for each power controller, receives the serial signals, and transmits each serial signal to a corresponding power controller. Each power controller controls the power control lines that connect the power controller and the respective testing computers to connect or disconnect according to the received serial signal. Each testing computer is installed in a motherboard under test.

The central server comprises: a setting module for setting the testing parameters, wherein the testing parameters comprises a test repeat ceiling, and a maximum time period allowed for all the testing computers to transmit confirmation information; an instruction transmitting module for transmitting the instructions regarding turning on or off the power sources of the testing computers to the serial device server; an information receiving module for receiving respective confirmation information from the testing computers, each transmitting of confirmation information confirming that the respective testing computer has been successfully started up; an information determining module for determining whether the information receiving module has received confirmation information from all the testing computers; a test running total controlling module for adding one to the running total of actual tests performed; and a test running total determining for determining whether the running total of tests performed is less than the test repeat ceiling.

To accomplish the second objective, the present invention provides a method for controlling power sources of motherboards under test through networks. The method comprises the steps of: (a) setting testing parameters; (b) transmitting instructions regarding turning on power sources of testing computers to the serial device server; (c) converting the instructions into serial instructions, generating serial signals, and transmitting the serial signals to the bus distributor; (d) transmitting the serial signals to corresponding power controllers; (e) turning on the power sources of the testing computers connected with the power controllers according to the serial signals; (f) determining whether the central server has received confirmation information from all testing computer confirming that each testing computer has been started up, and presuming there is something wrong with motherboards installed in the one or more testing computers if the central server has not received the confirmation information from one or more testing computers within a maximum time preset period; (g) transmitting instructions regarding turning off the power sources of the testing computers to the serial device server; (h) converting the instructions into serial instructions, generating serial signals, and transmitting the serial signals to the bus distributor; (i) transmitting the serial signals to the power controllers; and (j) turning off the power sources of the testing computers connected with the power controller according to the serial signals.

Other objects, advantages and novel features of the present invention will be drawn from the following detailed description of a preferred embodiment and preferred method of the present invention with the attached drawings, in which:

DETAILED DESCRIPTION OF THE PREFERRED EMBODIMENT

Figure 1:
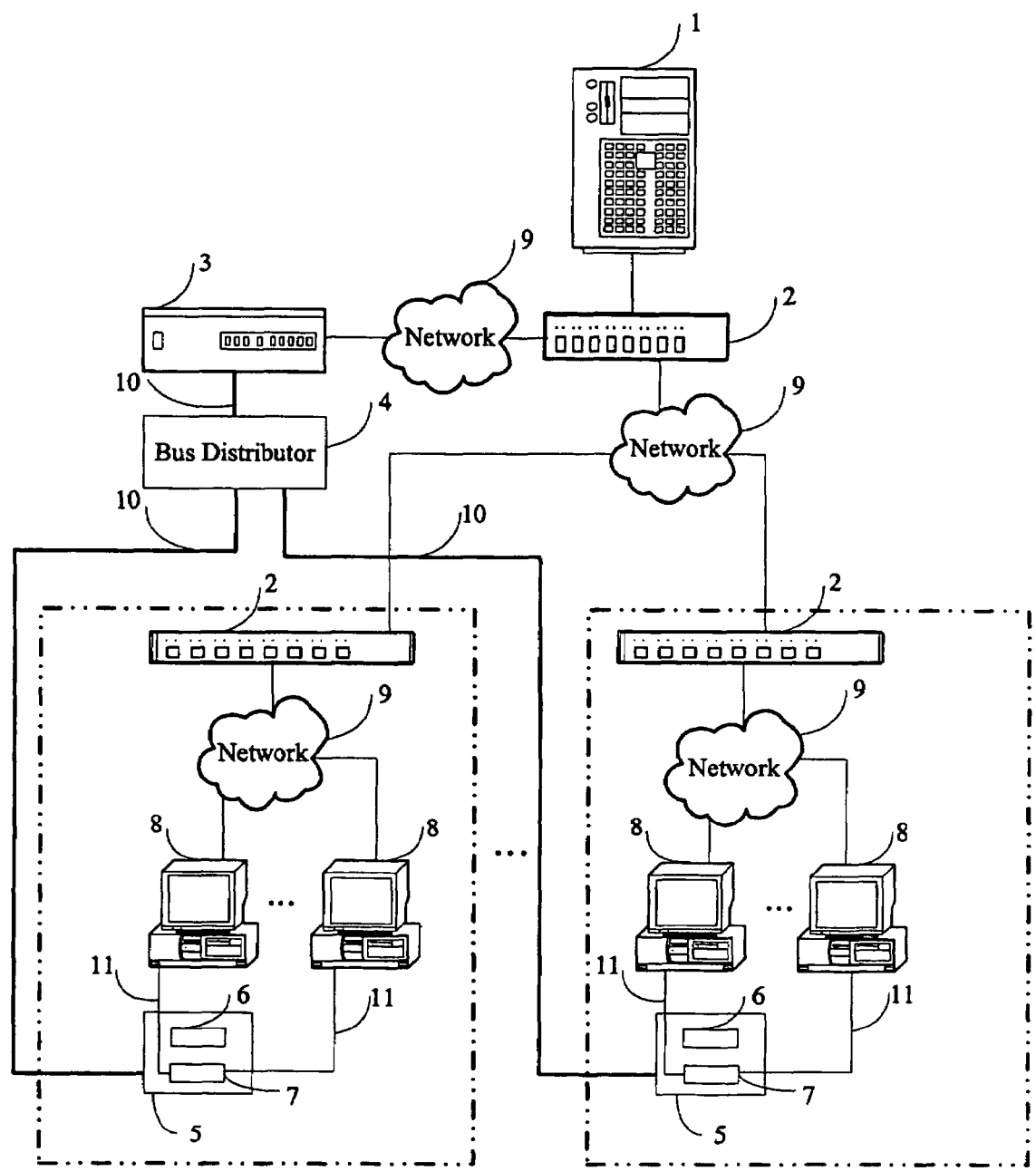
FIG. 1 is a schematic diagram of hardware configuration of a system for controlling power sources of motherboards under test through networks in accordance with the preferred embodiment of the present invention.

Referring now to the drawings, FIG. 1 is a schematic diagram of hardware configuration of a system for controlling power sources of motherboards under test through networks (hereinafter, "the system") in accordance with the preferred embodiment of the present invention. The system comprises a central server 1, a plurality of routers 2, a serial device server 3, a bus distributor 4, a plurality of power controllers 5, and a plurality of testing computers 8 in which motherboards (not shown) under test are installed. The central server 1 is connected with the serial device server 3 via one of the routers 2. The serial device server 3 and the power controllers 5 are connected with the bus distributor 4 via serial lines 10. Each power controller 5 is connected with a certain number of testing computers 8 via power control lines 11. The power controller 5 has eight power control lines 11, therefore the maximum number of testing computers 8 controlled by the power controller 5 is eight. A plurality of networks 9 are provided for connecting the serial device server 3 and said one of the routers 2 to the central server 1, and for connecting the testing computers 8 to corresponding other routers 2. Each network 9 may be any suitable communication architecture required by the system, such as an intranet. Further or alternatively, any two or more or even all of the networks 9 may collectively be the Internet.

The central server 1 is provided for setting testing parameters. The central server 1 is also provided for transmitting instructions to the serial device server 3 regarding turning on or off power sources of the testing computers 8, in order to control the power sources. The serial device server 3 is used for converting the instructions into serial instructions, and generating corresponding serial signals. The serial device server 3 may be an 8/16-port serial device server, a 4-port serial device server, a 2-port serial device server, or a 1-port serial device server. The bus distributor 4 can distribute an address for each power controller 5, receive the serial signals from the serial device server 3, and transmit each serial signal to a corresponding power controller 5. Consequently, the serial device server 3 can control the power controllers 5 via the bus distributor 4. Each power controller 5 comprises a Single Chip Micyoco (SCM) 6 and a relay 7. The SCM 6 controls the relay 7 to connect or disconnect the power control lines 11 that connect the power controller 5 and corresponding testing computers 8, according to the serial signal received by the power controller 5. The relay 7 duly connects or disconnects the power control lines 11, such that the power sources of the testing computers 8 are turned on or turned off. Each testing computer 8 contains a single motherboard under test.

Figure 2:
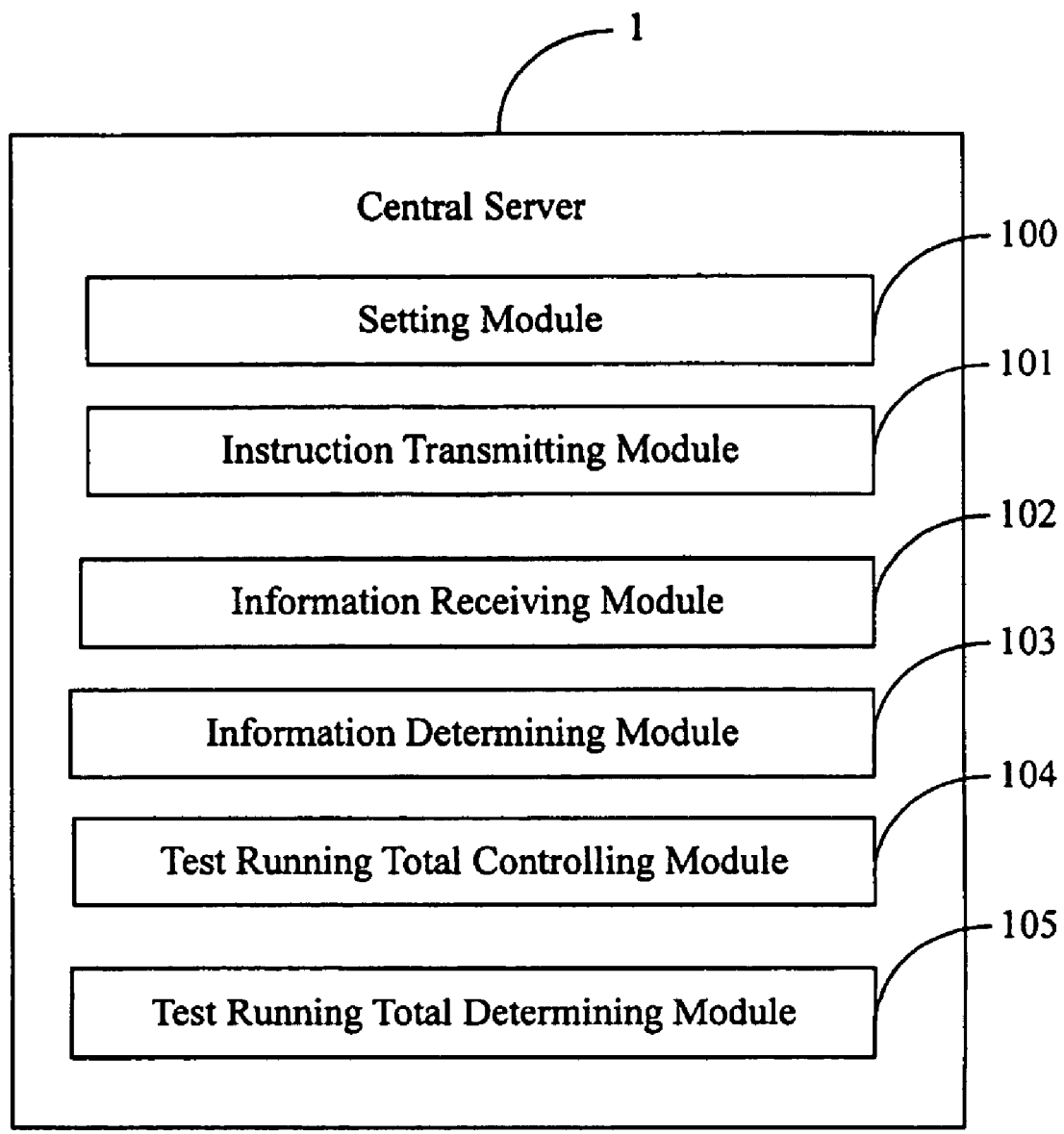
FIG. 2 is a schematic diagram of main function modules of a central server of the system of FIG. 1.

FIG. 2 is a schematic diagram of main function modules of the central server 1. The central server 1 comprises a setting module 100, an instruction transmitting module 101, an information receiving module 102, an information determining module 103, a test running total controlling module 104, and a test running total determining module 105.

The setting module 100 is provided for setting testing parameters. The testing parameters include a test repeat ceiling, and a period $T_0$. The test repeat ceiling is the maximum number of times that the motherboard of each testing computer 8 can be tested, which is the same as the maximum number of times that the power source of the testing computer 8 can be turned on or off. The setting module 100 can also initialize a running total of actual tests performed to zero. The period $T_0$ is a maximum time period allowed for all the testing computers 8 to transmit confirmation information, each such transmission confirming that the respective testing computer 8 has been successfully started up. The instruction transmitting module 101 is used for transmitting instructions to the serial device server 3 regarding turning on or off the power sources of the testing computers 8.

The information receiving module 102 is programmed to receive the confirmation information from the testing computers 8. The information determining module 103 determines whether the information receiving module 102 has received confirmation information from all the testing computers 8. If the information receiving module 102 has not received confirmation information from any testing computer 8 within the preset period $T_0$, the central server 1 presumes that there is something wrong with the motherboard installed in the testing computer 8, and stores the test results. In contrast, if the information receiving module 102 has received confirmation information from all the testing computers 8, the central server 1 presumes that the motherboards installed in all the testing computers 8 are flawless. Then, the test times controlling module 104 adds one to the running total of actual tests performed. The test times determining module 105 determines whether the test running total is less than the test repeat ceiling.

Figure 3:
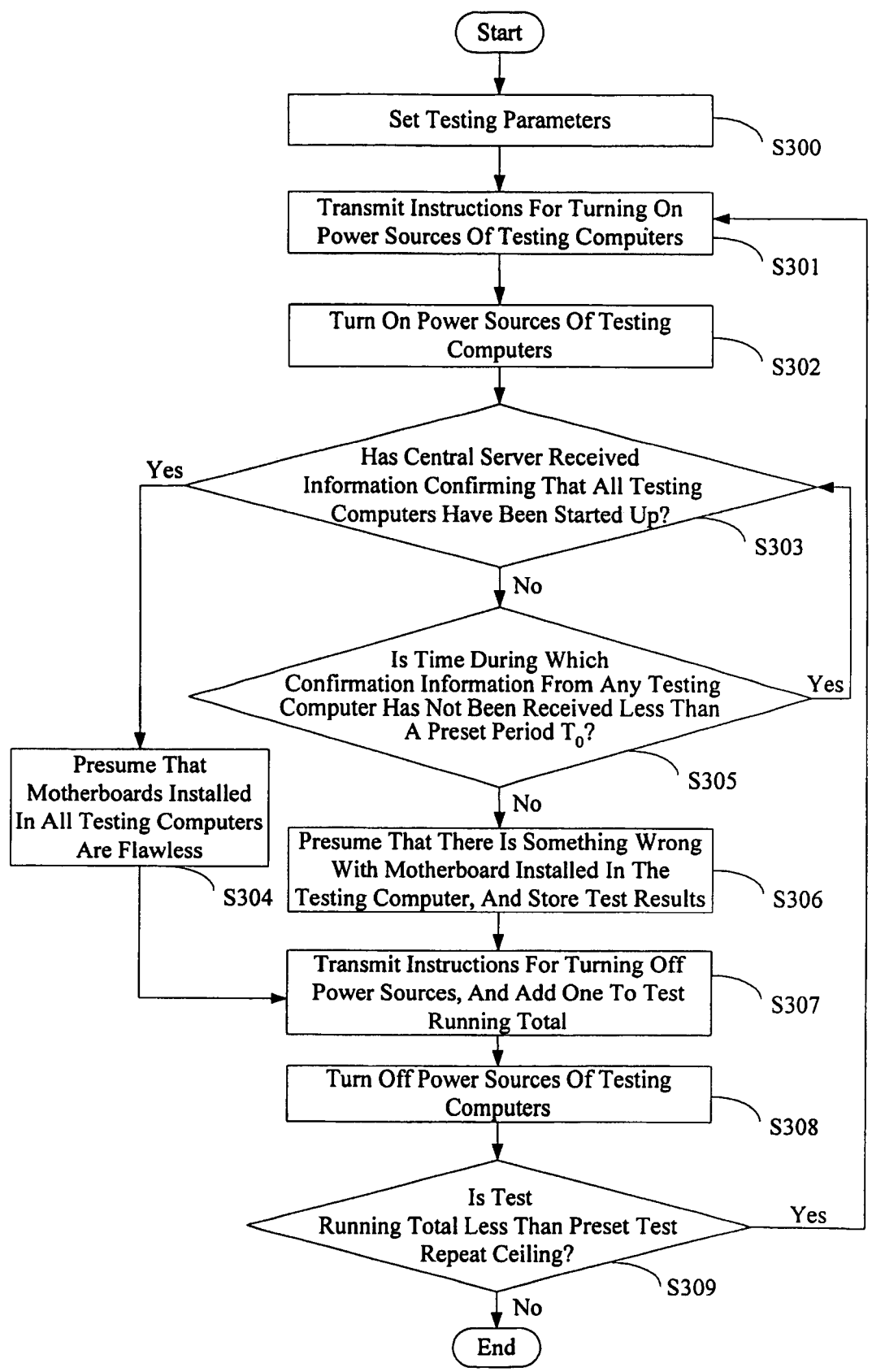
FIG. 3 is a flowchart of the preferred method of implementing the system of FIG. 1.

FIG. 3 is a flowchart of the preferred method of implementing the system. For simplicity, the preferred method will be described with regard to only one of the power controllers 5. In step S300, the setting module 100 sets testing parameters. The testing parameters include a test repeat ceiling and a period $T_0$. The period $T_0$ is a maximum time period allowed for all the testing computers 8 to transmit confirmation information, each such transmission confirming that the respective testing computer 8 has been successfully started up. A running total of actual tests performed is initialized to zero.

In step S301, the instruction transmitting module 101 transmits instructions to the power controller 5 regarding turning on the power sources of the corresponding testing computers 8. In step S302, the power controller 5 turns on the power sources according to the instructions. In step S303, the information determining module 103 determines whether the information receiving module 102 has received confirmation information from all the testing computers 8. In the preferred embodiment, when each testing computer 8 has been successfully started up, the testing computer 8 transmits confirmation information to the central server 1. If the information receiving module 102 has received confirmation information from all the testing computers 8, in step S304, the central server 1 presumes that the motherboards installed in all the testing computers 8 are flawless, whereupon the procedure goes to step S307 described below. Otherwise, if the information receiving module 102 has not received confirmation information from any testing computer 8, in step S305, the information determining module 103 determines whether a time during which the confirmation information has not been received is less than a preset period $T_0$. If the time is less than the preset period $T_0$, the procedure returns to step S303 described above. In contrast, if the time is equal to or longer than the preset period $T_0$, in step S306, the central server 1 presumes that there is something wrong with the motherboard installed in the testing computer 8, and stores the test results. In step S307, the instruction transmitting module 101 transmits instructions to the power controller 5 regarding turning off the power sources of the testing computers 8. Then, the test times controlling module 104 adds one to the running total of actual tests performed. In step S308, the power controller 5 turns off the power sources of the testing computers 8 according to the instructions. In step S309, the test running total determining module 105 determines whether the test running total is less than a preset test repeat ceiling. If the test running total is less than the preset test repeat ceiling, the procedure returns to step S301 described above. In contrast, if the test running total is equal to or more than the preset test repeat ceiling, the procedure is finished.

Figure 4:
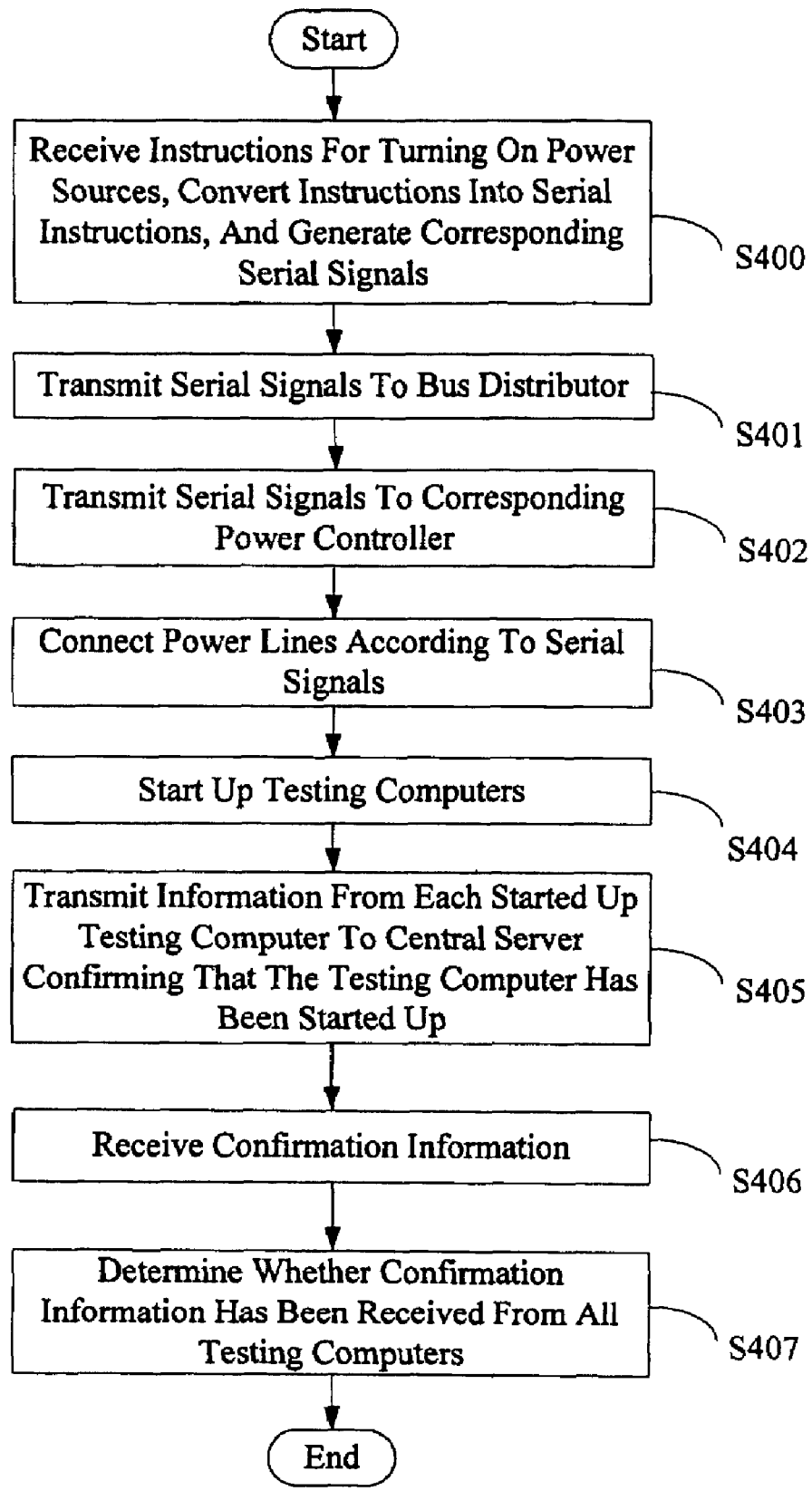
FIG. 4 is a flowchart of details of one step of FIG. 3, namely determining whether an information receiving module has received confirmation information from all testing computers.

FIG. 4 is a flowchart of details of step S303 of FIG. 3, namely determining whether the information receiving module 102 has received confirmation information from all the testing computers 8. In step S400, the serial device server 3 receives the instructions regarding turning on the power sources of the testing computers 8, converts the instructions into serial instructions, and generates corresponding serial signals. In step S401, the serial device server 3 transmits the serial signals to the bus distributor 4. In step S402, the bus distributor 4 receives the serial signals, and transmits a corresponding one of the serial signals to the power controller 5 connected with the testing computers 8. In step S403, the SCM 6 controls the relay 7 to connect the power control lines 11 between the power controller 5 and the respective testing computers 8. In step S404, one, more or all of the testing computers 8 start up. In step S405, each testing computer 8 started up transmits confirmation information to the central server 1. In step S406, the information receiving module 102 receives the confirmation information. In step S407, the information determining module 103 determines whether the information receiving module 102 has received confirmation information from all the testing computers 8, whereupon the procedure is finished.

Figure 5:
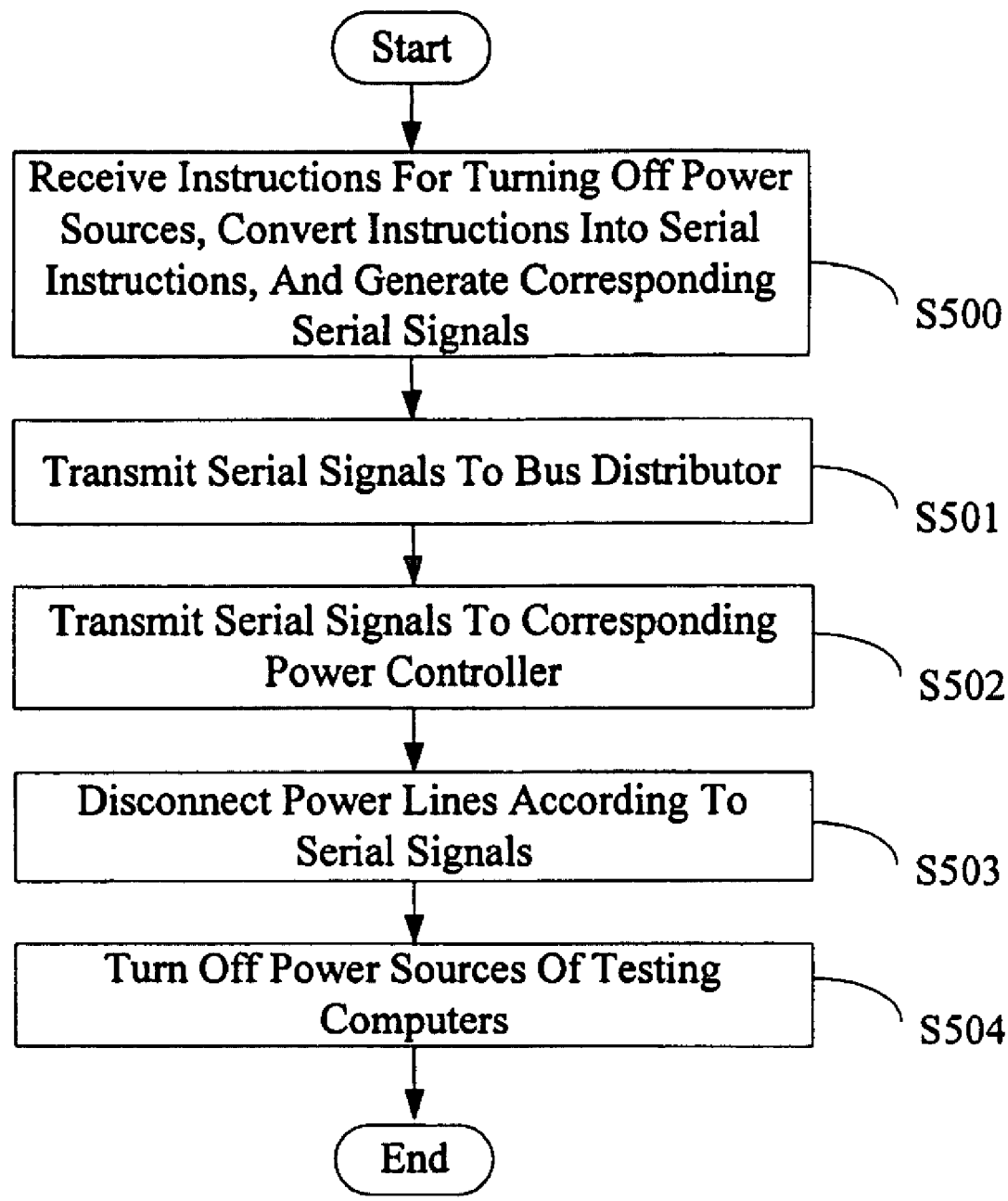
FIG. 5 is a flowchart of details of another step of FIG. 3, namely turning off power sources of the testing computers.

FIG. 5 is a flowchart of details of step S308 of FIG. 3, namely turning off the power sources of the testing computers 8. In step S500, the serial device server 3 receives instructions regarding turning off the power sources of the testing computers 8, converts the instructions into serial instructions, and generates corresponding serial signals. In step S501, the serial device server 3 transmits the serial signals to the bus distributor 4. In step S502, the bus distributor 4 receives the serial signals, and transmits a corresponding one of the serial signals to the power controller 5 connected with the testing computers 8. In step S503, the SCM 6 controls the relay 7 to disconnect the power control lines 11 between the power controller 5 and the respective testing computers 8. In step S504, all the power sources of the testing computers 8 are accordingly turned off, whereupon the procedure is finished.

Although the present invention has been specifically described on the basis of a preferred embodiment and preferred method, the invention is not to be construed as being limited thereto. Various changes or modifications may be made to the embodiment and method without departing from the scope and spirit of the invention.

What is claimed is:

1. A system for controlling power sources of motherboards under test through networks, the system comprising a central server, a serial device server, a bus distributor, a plurality of power controllers, and a plurality of testing computers connected with the power controllers through power control lines, wherein:
   the motherboards under test are installed in the testing computers;
   the central server sets testing parameters, and transmits instructions regarding turning on or off power sources of the testing computers to the serial device server in order to control the power sources;
   the serial device server converts the instructions into serial instructions, and generates corresponding serial signals;
   the bus distributor distributes an address for each power controller, receives the serial signals, and transmits each serial signal to a corresponding power controller; and
   each power controller controls the power control lines that connect the power controller and the respective testing computers, in order to connect or disconnect the power control lines according to the received serial signal.

2. The system as claimed in claim 1, wherein the central server comprises:
   a setting module for setting the testing parameters, wherein the testing parameters comprises a test repeat ceiling, and a maximum time period allowed for all the testing computers to transmit confirmation information;
   an instruction transmitting module for transmitting the instructions regarding turning on or off the power sources of the testing computers to the serial device server;
   an information receiving module for receiving respective confirmation information from the testing computers, each transmission of confirmation information confirming that the respective testing computer has been successfully started up;
   an information determining module for determining whether the information receiving module has received confirmation information from all the testing computers;
   a test running total controlling module for adding one to a running total of tests performed; and
   a test running total determining module for determining whether the running total of tests performed is less than the test repeat ceiling.

3. The system as claimed in claim 2, wherein the central server presumes that the motherboards installed in all the testing computers are flawless if the information receiving module has received confirmation information from all the testing computers within the maximum time period.

4. The system as claimed in claim 2, wherein the central server presumes that there is something wrong with a motherboard installed in a testing computer if the information receiving module has not received confirmation information from that testing computer within the maximum time period.

5. The system as claimed in claim 1, whether each power controller comprises a relay for connecting or disconnecting the power control lines that connect the power controller and the respective testing computers, and a Single Chip Micyoco (SCM) for controlling the relay to connect or disconnect said power control lines according to the received serial signal.

6. A method for controlling power sources of motherboards under test through networks, comprising the steps of:
   (a) providing a central server, a serial device server, a bus distributor, a plurality of power controllers, and a plurality of testing computers in which motherboards under test are installed;
   (b) setting testing parameters;
   (c) transmitting instructions regarding turning on power sources of the testing computers to the serial device server;
   (d) converting the instructions into serial instructions, generating serial signals, and transmitting the serial signals to the bus distributor;
   (e) transmitting the serial signals to corresponding power controllers;
   (f) turning on the power sources of the testing computers connected with the power controllers according to the serial signals;
   (g) determining whether the central server has received confirmation information from all the testing computers confirming that each testing computer has been started up;
   (h) presuming that there is something wrong with motherboards installed in the one or more testing computer if the central server has not received confirmation information from the one or more testing computers within a maximum time period, wherein the maximum time period is a testing parameter;
   (i) transmitting instructions regarding turning off the power sources of the testing computers to the serial device server;
   (j) converting the instructions into serial instructions, generating serial signals, and transmitting the serial signals to the bus distributor;
   (k) transmitting the serial signals to the power controllers; and
   (l) turning off the power sources of the testing computers connected with the power controllers according to the serial signals.

7. The method as claimed in claim 6, further comprising the step of presuming that all the motherboards installed in the testing computers are flawless if the central server has received confirmation information from all the testing computers within the preset period.

8. The method as claimed in claim 6, wherein said testing parameters comprise a test repeat ceiling.

9. The method as claimed in claim 8, further comprising the step of determining whether a running total of tests performed is less than the test repeat ceiling, and repeating steps (c) through (l) if the test running total is less than the test repeat ceiling.

10. The method as claimed in claim 6, further comprising the step of presuming that the motherboards installed in the one or more testing computers are flawless and transmitting the instructions regarding turning off power sources of the testing computers if the central server has received confirmation information from all the testing computers within the maximum time period.

11. A method for testing power function of computer systems, comprising the steps of:
   providing power control on each of said computer system and transmission of resulting information of said testing from said each computer system;
   assigning an identifiable address to said each computer system;
   powering and starting said each computer system according to said identifiable address;
   retrieving and recording said resulting information from said each computer system according to said identifiable address; and
   shutting off said each computer system according to said identifiable address.

12. The method as claimed in claim 11, further comprising the step of converting a user instruction of powering and starting said each computer system into a plurality of serial signals according to said identifiable address so as to power and start said each computer system in said powering and starting step via said plurality of serial signals.

13. The method as claimed in claim 11, further comprising the step of grouping said computer systems before said address-assigning step so as to assign said identifiable address to said each computer system based on grouping information.

* * * * *